United States Patent
Chuo et al.

(10) Patent No.: US 7,427,772 B2
(45) Date of Patent: Sep. 23, 2008

(54) SEMICONDUCTOR LIGHT EMITTING DEVICE SUBSTRATE AND METHOD OF FABRICATING THE SAME

(75) Inventors: Chang-Cheng Chuo, Hsinchu County (TW); Chih-Ming Lai, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/470,620

(22) Filed: Sep. 6, 2006

(65) Prior Publication Data
US 2007/0290188 A1   Dec. 20, 2007

(30) Foreign Application Priority Data
Jun. 16, 2006   (TW) ............................... 95121557 A

(51) Int. Cl.
*H01L 29/06* (2006.01)
*H01L 29/26* (2006.01)
*H01L 21/00* (2006.01)

(52) U.S. Cl. .................. 257/13; 257/79; 257/E29.322; 438/22

(58) Field of Classification Search .................. 257/9, 257/12, 13, 79, 918, E29.322; 438/478, 481, 438/503, 509, 479, 22, 79
See application file for complete search history.

(56) References Cited

U.S. PATENT DOCUMENTS

| 5,990,479 | A  | * | 11/1999 | Weiss et al. ................. 250/307 |
| 6,210,997 | B1 | * | 4/2001  | Adachi et al. ............... 438/151 |
| 6,344,403 | B1 | * | 2/2002  | Madhukar et al. ........... 438/503 |
| 2003/0102469 | A1 | * | 6/2003 | Jones et al. ..................... 257/9 |
| 2004/0094773 | A1 | * | 5/2004 | Kiyoku et al. .............. 257/103 |
| 2005/0082543 | A1 | * | 4/2005 | Alizadeh et al. .............. 257/79 |
| 2006/0060888 | A1 |   | 3/2006  | Kim et al. |
| 2007/0166916 | A1 | * | 7/2007 | Solomon et al. ............ 438/257 |

FOREIGN PATENT DOCUMENTS

| TW | 536841 | 6/2003 |
| TW | 561632 | 11/2003 |

OTHER PUBLICATIONS

Xiao Hong, "Introduction to semiconductor manufacturing technology", 2001, pp. 220-224.

* cited by examiner

*Primary Examiner*—Long K Tran
(74) *Attorney, Agent, or Firm*—Jianq Chyun IP Office

(57) ABSTRACT

A substrate for semiconductor light emitting devices is provided. The substrate is characterized in that the substrate is a single crystal material and has a nanocrystal structure capable of diffracting an electromagnetic wave. The nanocrystal structure is disposed on a surface portion of the substrate and includes an etched region and an unetched region, wherein the etched region has a depth of 10-200 nm. Due to the periodicity of the nanocrystal structure, the semiconductor material grown on the substrate has fewer defects, and the material stress is reduced.

13 Claims, 5 Drawing Sheets

SEMICONDUCTOR LIGHT EMITTING DEVICE SUBSTRATE AND METHOD OF FABRICATING THE SAME

CROSS-REFERENCE TO RELATED APPLICATION

This application claims the priority benefit of Taiwan application serial no. 95121557, filed Jun. 16, 2006. All disclosure of the Taiwan application is incorporated herein by reference.

BACKGROUND OF THE INVENTION

1. Field of the Invention

The present invention relates to a semiconductor light emitting device structure and a method of fabricating the same. More particularly, the present invention relates to a semiconductor light emitting device structure having a nanocrystal structure and a method of fabricating the same.

2. Description of Related Art

Distinct from the light emitting theory of regular fluorescent lamps or incandescent lamps generating heat to emit light, semiconductor light emitting devices such as light emitting diodes takes advantage of the specific property of semiconductor to emit light, and thus the light emitted by light emitting diodes is referred to as cold luminescence. The light emitting diodes have advantages of long service life, light weight, and low power consumption, and being free of harmful substance such as mercury, so the light emitting diodes used instead to illuminate can save a large amount of energy.

Currently, a nanocrystal light emitting diode is proposed to improve the light emitting diode. Researchers found that like the frequency band structure in the state of electromagnetic wave being transmitted in periodic dielectric, a photonic band substance can be achieved by the periodic changing of more than two kinds of materials with different refraction index (or dielectric constant), thereby paving a way for developing the above nanocrystal light emitting diode.

FIG. 1 is a schematic sectional view of the conventional nanocrystal light emitting diode, in which a periodically arranged nanocrystal structure is fabricated on the semiconductor layer on the light emitting layer.

Referring to FIG. 1, the conventional light emitting diode mainly includes a substrate 100, an N-type GaN layer 102, a P-type GaN layer 104, a light emitting layer 106, a transparent conductive layer 108, electrodes 110, 112, and an insulating layer 114, wherein the surface of the P-type GaN layer 104 has a pattern 104a. The N-type GaN layer 102 and the P-type GaN layer 104 are successively disposed on the substrate 100, and the light emitting layer 106 is disposed between the N-type GaN layer 102 and the P-type GaN layer 104. The transparent conductive layer 108 is disposed on the surface of the P-type GaN layer 104, and the electrodes 110 and 112 are respectively disposed on the N-type GaN layer 102 and the transparent conductive layer 108, wherein the insulating layer 114 is disposed beneath the transparent conductive layer 108 and separates the electrode 112 and the P-type GaN layer 104.

The nanocrystal mainly functions as changing the refraction of light, such that the light emitted from the active light emitting layer can be successfully sent out, and is not totally reflected inside the light emitting diode. Therefore, the nanocrystal light emitting diode has higher extraction efficiency than the conventional light emitting diode.

However, the pattern 104a (i.e., the nanocrystal structure) of the P-type GaN layer 104 is usually fabricated in manner of etching, such that the defect density at the etched portions increases, leading to the increase of resistance, thus influencing the electrical property of the light emitting diode.

SUMMARY OF THE INVENTION

The present invention is related to a semiconductor light emitting device substrate, so as to obtain higher light emitting efficiency by the use of the semiconductor light emitting device grown on the substrate.

Moreover, the present invention is related to a semiconductor light emitting device substrate, so as to obtain higher output power by the use of the semiconductor light emitting device grown on the substrate.

Furthermore, the present invention is related to a method of fabricating a semiconductor light emitting device substrate, which can decrease the defect and stress of the semiconductor light emitting device grown on the substrate.

The present invention provides a semiconductor light emitting device substrate, which is characterized in that the substrate is a single crystal material and has a nanocrystal structure capable of diffracting an electromagnetic wave, the nanocrystal structure is disposed on a surface portion of the substrate and has an etched region and an unetched region, wherein the etched region has a depth of 10-200 nm.

The present invention provides another semiconductor light emitting device substrate, which comprises a single crystal material and an undoped nitride semiconductor layer. The single crystal material has a nanocrystal structure suitable for diffracting an electromagnetic wave, and the nanocrystal structure is disposed on a surface portion of the single crystal material and has an etched region and an unetched region, wherein the etched region has a depth of 10-200 nm. The undoped nitride semiconductor layer is disposed on the surface of the single crystal material, wherein the single crystal material and the undoped nitride semiconductor layer form a substrate.

The present invention further provides a method of fabricating a semiconductor light emitting device substrate, which comprises providing a single crystal material. Next, a nanocrystal structure is formed on a surface of the single crystal material, wherein the nanocrystal structure has an etched region and an unetched region. Next, a nitride semiconductor material is grown on the surface of the single crystal material with an epitaxial process, so as to form a substrate.

Because to the periodic nanocrystal structure is disposed on the surface of the substrate, the present invention has the following advantages. (1) The semiconductor material grown on the substrate has fewer defects. (2) The semiconductor light emitting device grown on the substrate has higher light emitting efficiency. (3) The semiconductor light emitting device grown on the substrate has higher optical output power. (4) The material stress of the semiconductor light emitting device grown on the substrate is reduced.

In order to make the aforementioned and other objects, features and advantages of the present invention comprehensible, preferred embodiments accompanied with figures are described in detail below.

DESCRIPTION OF EMBODIMENTS

Figure 2:
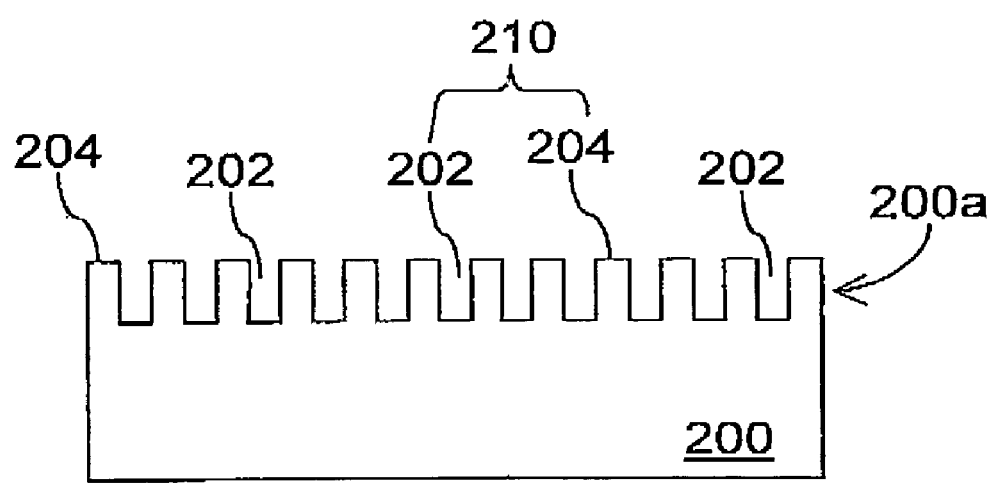
FIG. 2 is a schematic sectional view of the semiconductor light emitting device substrate according to a first embodiment of the present invention.

FIG. 2 is a schematic sectional view of the semiconductor light emitting device substrate according to the first embodiment of the present invention.

Referring to FIG. 2, the semiconductor light emitting device substrate 200 of the first embodiment has a nanocrystal structure 210, which is a periodic structure. The nanocrystal structure 210 is disposed on a surface 200a portion of the substrate 200, and has an etched region 202 and an unetched region 204. The material of the substrate 200 is a single crystal material, for example, transmissive and does not absorb in wavelength range of visible light and infrared light. The single crystal material is, for example, $Al_2O_3$ (sapphire), $LiAlO_2$, $LiGaO_2$, SiC, GaN, AlN, AlGaN, or another suitable single crystal material.

Referring to FIG. 2 again, the step of forming the nanocrystal structure 210 includes defining a pattern on the surface 200a of the single crystal material with a lithographic process, which is a pattern such as a network, columnar, or another periodically arranged geometric pattern exhibited by the nanocrystal structure 210, as shown in FIG. 3 to FIG. 6.

Figure 3:
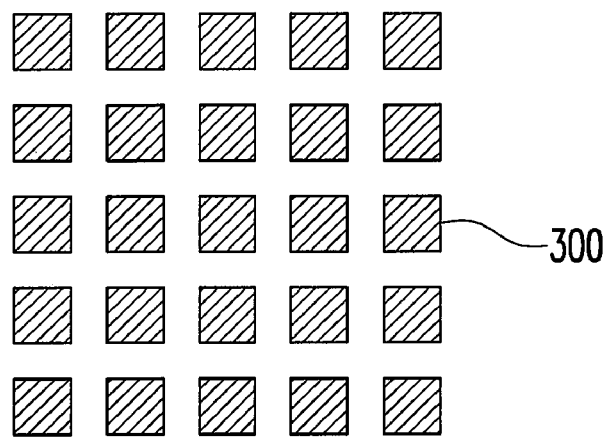
FIG. 3 and FIG. 4 are top views of two kinds of tetragonal lattice patterns on the surface of the substrate according to the first embodiment of the present invention.
Figure 4:
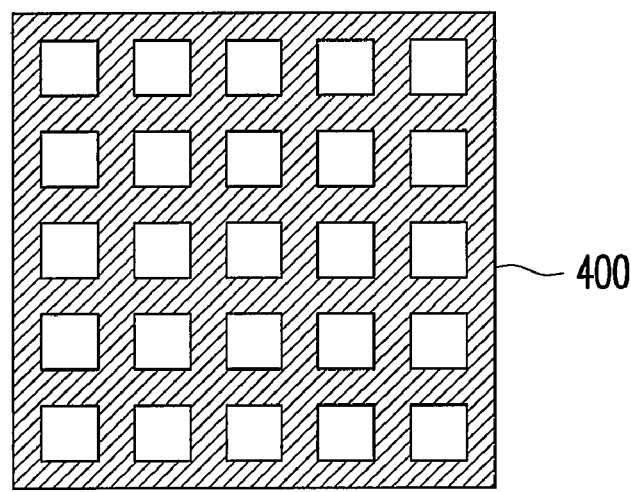
Figure 5:
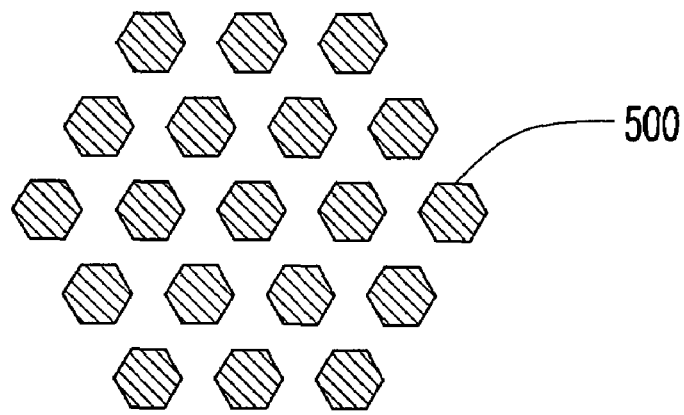
FIG. 5 and FIG. 6 are top views of two kinds of hexagonal lattice patterns on the surface of the substrate according to the first embodiment of the present invention.
Figure 6:
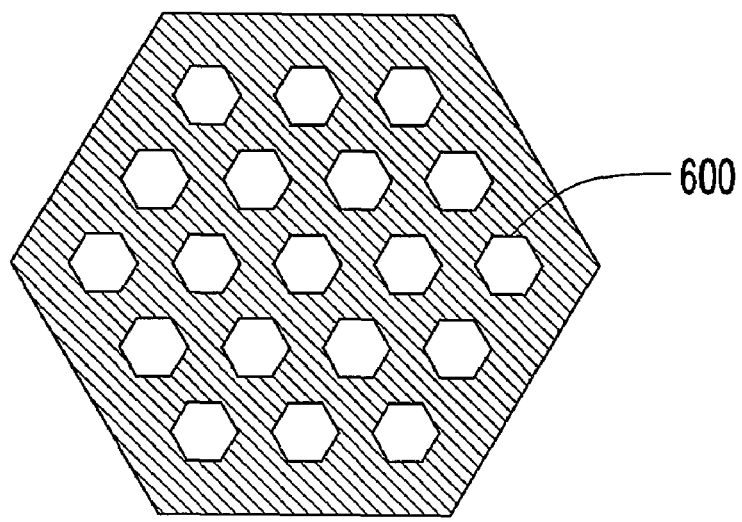

The geometric pattern as shown in FIG. 3 is a tetragonal packed nanocrystal 300, the geometric pattern as shown in FIG. 4 is a tetragonal packed network nanocrystal 400, the geometric pattern as shown in FIG. 5 is a hexagonal close-packed columnar nanocrystal 500, and the geometric pattern as shown in FIG. 6 is a hexagonal close-packed network nanocrystal 600. Moreover, in the periodic structure having a plurality of crystals, the size of each of the crystals is about 100-900 nm, and each crystal is quadrilateral-shaped, pentagon-shaped, hexagon-shaped, or polygon-shaped, as shown in the figure.

Referring to FIG. 2 again, the lithographic process is a process such as laser interference lithography, holography-lithography, E-beam lithography, X-ray lithography, nano lithography, and nano imprinting. Next, an etching process is performed on the surface 200a of the single crystal material to form the nanocrystal structure 210. The etching process includes dry etching or wet etching. Moreover, the surface roughness of the etched region 202 is greater than that of the unetched region 204.

The substrate of the first embodiment can be directly applied in all commonly-used blue, green, and white light emitting diodes. A semiconductor light emitting device fabricated by the use of the substrate of the first embodiment of the present invention is illustrated with reference to an embodiment below. However, it is not intended to limit the application scope of the present invention.

Figure 7:
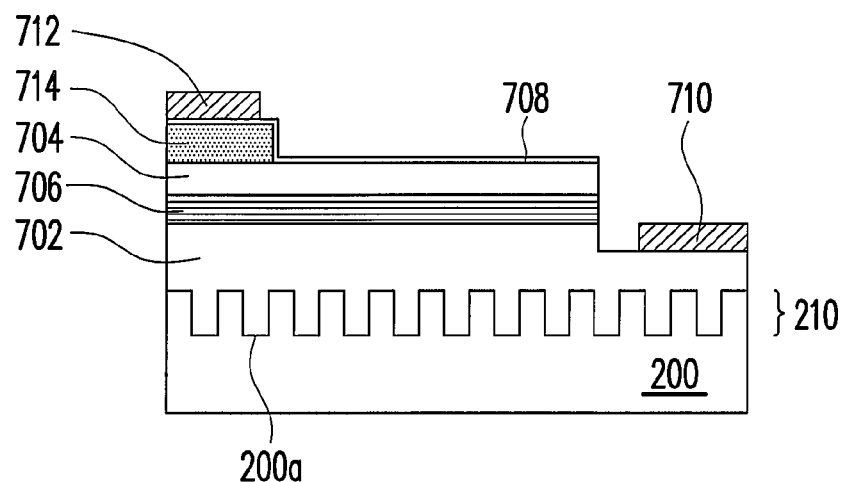
FIG. 7 is a schematic sectional view of a light emitting diode fabricated on the semiconductor light emitting device substrate of FIG. 2.

Referring to FIG. 7, a schematic sectional view of a light emitting diode fabricated on the semiconductor light emitting device substrate of FIG. 2 is shown. The light emitting diode in the figure includes a substrate 200, a first-type doped semiconductor layer 702, a second-type doped semiconductor layer 704, a light emitting layer 706, a transparent conductive layer 708, electrodes 710, 712, and an insulating layer 714, wherein a surface 200a of the substrate 200 has a nanocrystal structure 210.

Referring to FIG. 7 again, the first-type doped semiconductor layer 702 and the second-type doped semiconductor layer 704 are successively disposed on the substrate 200, the light emitting layer 706 is disposed between the first-type and second-type doped semiconductor layers 702 and 704, wherein the first-type doped semiconductor layer 702 is, for example, N-type GaN layer, and the second-type doped semiconductor layer 704 is, for example, P-type GaN layer. The transparent conductive layer 708 is disposed on the surface of the second-type doped semiconductor layer 704, the electrodes 710 and 712 are respectively disposed on the first-type doped semiconductor layer 702 and the transparent conductive layer 708, wherein the insulating layer 714 is disposed below the transparent conductive layer 708 and separates the electrode 712 and the second-type doped semiconductor layer 704.

The substrate 200 has the nanocrystal structure 210, so the semiconductor light emitting device fabricated by the use of the substrate 200 has higher optical output power and higher light emitting efficiency. Particularly, when the semiconductor light emitting device is applied in a flip-chip process, the extraction efficiency can be further improved.

Figure 8:
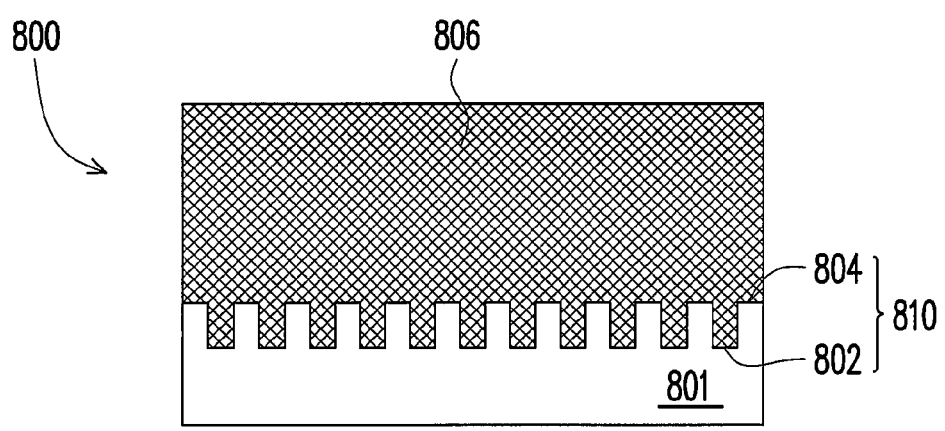
FIG. 8 is a schematic sectional view of the semiconductor light emitting device substrate according to a second embodiment of the present invention.

FIG. 8 is a schematic sectional view of a semiconductor light emitting device substrate according to the second embodiment of the present invention.

Referring to FIG. 8, the second embodiment is similar to the first embodiment, and only the difference is described below. In addition to a single crystal material 801 having a nanocrystal structure 810, the substrate 800 of the second embodiment further includes an undoped nitride semiconductor layer 806 on the surface of the single crystal material 801. The single crystal material 801 and the undoped nitride semiconductor layer 806 form a substrate, and the nanocrystal structure 810 also has an etched region 802 and an unetched region 804. The material of the substrate is, for example, transmissive and does not absorb in wavelength range of visible light and infrared light. The undoped nitride semiconductor layer 806 is, for example, a nitride semiconductor material containing at least one of In, Al, or Ga, such as GaN, AlN, InN, AlGaN, InGaN, AlInN, and InGaAlN. Furthermore, the nitride semiconductor material (i.e., the undoped nitride semiconductor layer 806) is formed with an epitaxial process, wherein the epitaxial process includes MBE, MOCVD, OMVPE, HVPE, PECVD, or sputter.

A semiconductor light emitting device fabricated by using the substrate of the second embodiment of the present invention is illustrated with reference to the embodiment below. However, it is not intended to limit the application scope of the present invention.

Figure 9:
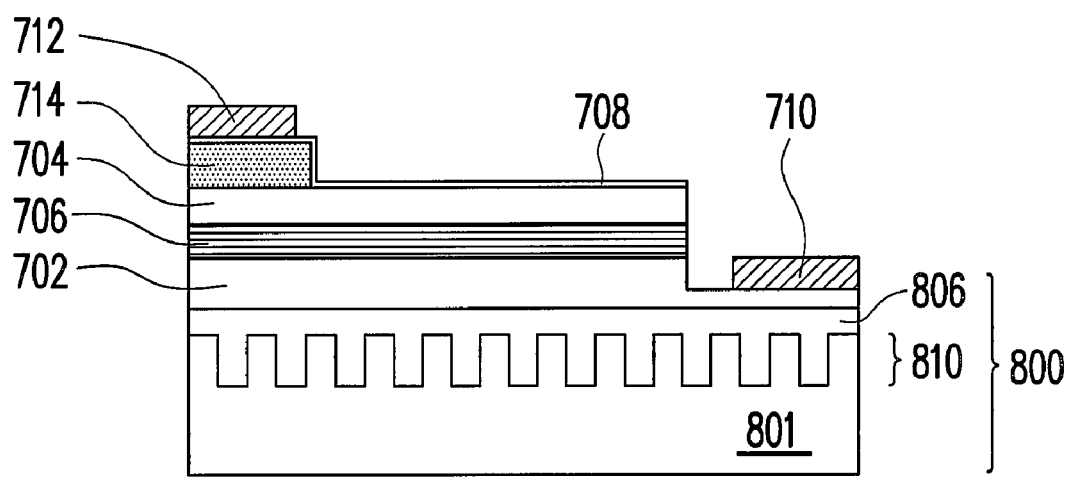
FIG. 9 is a schematic sectional view of a light emitting diode fabricated on the semiconductor light emitting device substrate of FIG. 8.

Referring to FIG. 9, a schematic sectional view of a light emitting diode fabricated on the semiconductor light emitting device substrate of FIG. 8 is shown. The light emitting diode in the figure includes a substrate 800 and the first-type doped semiconductor layer 702, the second-type doped semiconductor layer 704, the light emitting layer 706, the transparent conductive layer 708, the electrodes 710, 712, and the insulating layer 714 which are the same as those in FIG. 7, and the position of each of the above layer is the same as that in FIG. 7. The substrate 800 is the same as that in FIG. 8, wherein an undoped nitride semiconductor layer 806 is disposed on the surface of the single crystal material 801.

The substrate 800 has a periodic nanocrystal structure 810, so with the lateral overgrowth property in the epitaxial growth, the grown undoped nitride semiconductor layer 806 has fewer defects. In addition, due to the nanocrystal structure 810, the semiconductor light emitting device fabricated on the substrate 800 has higher optical output power and higher light emitting efficiency. Particularly, when the semiconductor light emitting device is applied in the flip-chip process, the extraction efficiency can be further improved.

Figure 1:
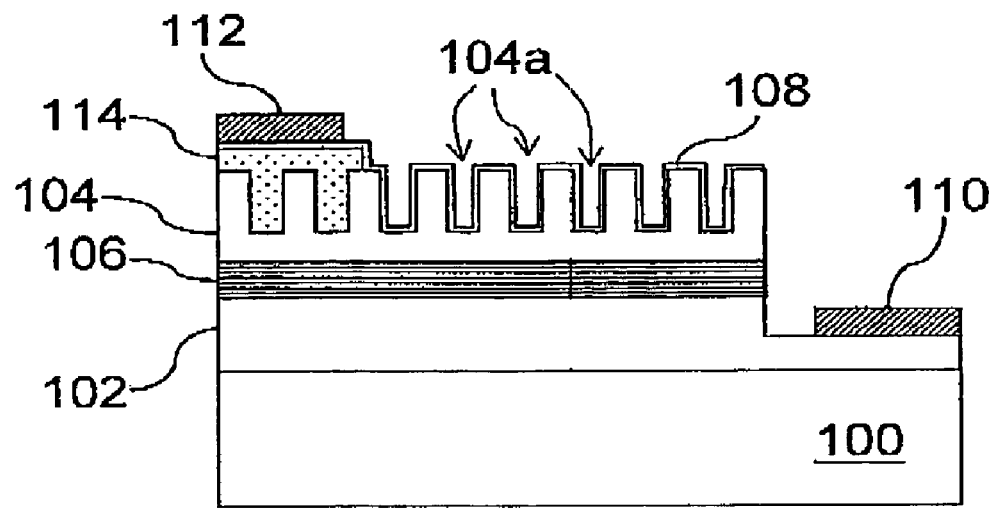
FIG. 1 is a schematic sectional view of the conventional nanocrystal light emitting diode.

To sum up, the substrate of the present invention has a periodic nanocrystal structure on the surface, so the defect of the semiconductor material grown on the substrate may be reduced during the epitaxial process, and the material stress of the semiconductor light emitting device grown on the substrate can also be reduced. In addition, due to the inherent advantages of the nanocrystal, the semiconductor light emitting device fabricated on the substrate has higher optical output power and higher light emitting efficiency. Furthermore, the light emitting diode formed on the substrate of the present invention does not have the pattern 104a (i.e., the nanocrystal structure) as shown in FIG. 1, thus the problem of the increasing defect density caused by etching can be avoided, thereby preventing the increase of resistance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor light emitting device substrate comprised of a single crystal material and having a nanocrystal structure disposed thereon capable of diffracting an electromagnetic wave, wherein a material of the nanocrystal structure is the same as the single crystal material, the nanocrystal structure comprises an etched region and an unetched region, wherein the etched region has a depth of 10-200 nm, and the nanocrystal structure comprises a periodic structure comprising a plurality of crystals with a size of 100-900 nm.

2. The semiconductor light emitting deviec substrate as claimed in claim 1, wherein each of the crystals has a quadrilateral-shape, a pentagon-shape, a hexagon-shape, or a polygon-shape.

3. The semiconductor light emitting device substrate as claimed in claim 2, wherein the periodic structure comprises at least a periodic pattern of tetragonal lattice or hexagonal lattice.

4. The semiconductor light emitting device substrate as claimed in claim 1, wherein a material of the substrate is transmissive and does not absorb light in a wavelength range of visible light and infrared light.

5. The semiconductor light emitting device substrate as claimed in claim 4, wherein the single crystal material comprises $Al_2O_3$, $LiAlO_2$, $LiGaO_2$, SiC, GaN, AlN, or AlGaN.

6. The semiconductor light emitting device substrate as claimed in claim 1, wherein a surface roughness of the etched region is greater than that of the unetched region.

7. A semiconductor light emitting device substrate, comprising:
   a single crystal material, having a nanocrystal structure disposed on a surface of the single crystal material capable of diffracting an electromagnetic wave, wherein a material of the nanocrystal structure is the same as the single crystal material, the nanocrystal structure comprises an etched region and an unetched region, wherein the etched region has a depth of 10-200 nm, and the nanocrystal structure is a periodic structure comprising a plurality of crystals with a size of 100-900 nm, and
   an undoped nitride semiconductor layer, disposed on the surface of the single crystal material with the single crystal material, wherein the single crystal material and the undoped nitride semiconductor layer form a substrate.

8. The semiconductor light emitting device substrate as claimed in claim 7, wherein the undoped nitride semiconductor layer comprises In, Al, or Ga.

9. The semiconductor light emitting device substrate as claimed in claim 7, wherein each of the crystals comprises a quadrilateral-shape, a pentagon-shape, a hexagon-shape, or a polygon-shape.

10. The semiconductor light emitting device substrate as claimed in claim 9, wherein the periodic structure comprises at least a periodic pattern of tetragonal lattice or hexagonal lattice.

11. The semiconductor light emitting device substrate as claimed in claim 7, wherein a material of the substrate is transmissive and does not absorb light in the wavelength range of visible light and infrared light.

12. The semiconductor light emitting device substrate as claimed in claim 7, wherein the single crystal material comprises $Al_2O_3$, $LiAlO_2$, $LiGaO_2$, SiC, GaN, AlN, or AlGaN.

13. The semiconductor light emitting device substrate as claimed in claim 7, wherein a surface roughness of the etched region is greater than that of the unetched region.

* * * * *